(12) United States Patent
Narui et al.

(10) Patent No.: US 8,680,540 B2
(45) Date of Patent: Mar. 25, 2014

(54) OPTICAL SEMICONDUCTOR APPARATUS HAVING A BIDIRECTIONAL COMMUNICATION SYSTEM EMPLOYING A SINGLE-CORE OPTICAL FIBER

(75) Inventors: Hironobu Narui, Kanagawa (JP); Tomonori Hino, Kanagawa (JP); Nobukata Okano, Kanagawa (JP); Jugo Mitomo, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/619,352

(22) Filed: Jan. 3, 2007

(65) Prior Publication Data
US 2007/0110449 A1  May 17, 2007

Related U.S. Application Data

(62) Division of application No. 11/192,727, filed on Jul. 29, 2005, now Pat. No. 7,196,357, which is a division of application No. 10/764,640, filed on Jan. 26, 2004, now Pat. No. 6,960,791.

(30) Foreign Application Priority Data

Jan. 28, 2003  (JP) ................................ P2003-018421

(51) Int. Cl.
*H01L 27/15* (2006.01)
*H01L 33/00* (2010.01)

(52) U.S. Cl.
USPC .................. 257/81; 257/80; 257/84; 257/99; 257/E33.076; 257/E33.077

(58) Field of Classification Search
USPC ........ 257/82, 80, 81, 83, 84, 85, E33.076, 99, 257/100, E33.062, E33.065, E33.066, 257/E33.077; 372/50.21
See application file for complete search history.

(56) References Cited

U.S. PATENT DOCUMENTS

| | | | | |
|---|---|---|---|---|
| 4,614,958 A | * | 9/1986 | Mikami et al. | 257/85 |
| 4,948,960 A | | 8/1990 | Simms et al. | |
| 5,533,041 A | * | 7/1996 | Matsuda et al. | 372/50.1 |
| 5,654,578 A | * | 8/1997 | Watanabe | 257/438 |
| 5,796,714 A | * | 8/1998 | Chino et al. | 372/50.124 |
| 5,900,619 A | | 5/1999 | Honda et al. | |

(Continued)

FOREIGN PATENT DOCUMENTS

| | | |
|---|---|---|
| JP | 57 078186 | 5/1982 |
| JP | 57 139976 | 8/1982 |

(Continued)

*Primary Examiner* — Robert Huber
(74) *Attorney, Agent, or Firm* — Dentons US LLP (57) ABSTRACT

The optical semiconductor apparatus includes, on an n-GaAs substrate, a surface-emitting semiconductor laser device and a photodiode integrated on the periphery of the laser device with an isolation region interposed there between. The laser device is composed of an n-DBR mirror, an active region, and a p-DBR mirror and includes a columnar layered structure with its sidewall covered with an insulating film. The photodiode is formed on the substrate and has a circular layered structure wherein an i-GaAs layer and a p-GaAs layer surrounds the laser device with an isolating region interposed between the i-GaAs and p-GaAs layers and the laser device. The diameter of the photodiode is smaller than the diameter of the optical fiber core optically coupled with the optical semiconductor apparatus. Since the laser device and the photodiode are monolithically integrated, the devices do not require optical alignment, and thus, facilitate optical coupling with an optical fiber.

3 Claims, 12 Drawing Sheets

(56) References Cited

U.S. PATENT DOCUMENTS

| | | | | |
|---|---|---|---|---|
| 5,903,585 A | * | 5/1999 | Dawson et al. | 372/45.011 |
| 5,914,976 A | * | 6/1999 | Jayaraman et al. | 372/50.21 |
| 6,526,080 B1 | * | 2/2003 | Shin | 372/45.01 |
| 6,753,214 B1 | | 6/2004 | Brinkmann et al. | |
| 2002/0003824 A1 | | 1/2002 | Lo et al. | |
| 2002/0181899 A1 | * | 12/2002 | Tartaglia et al. | 385/89 |
| 2005/0025207 A1 | | 2/2005 | Thornton et al. | |

FOREIGN PATENT DOCUMENTS

| | | | | |
|---|---|---|---|---|
| JP | 57 172783 | | 10/1982 | |
| JP | 57 173984 | | 10/1982 | |
| JP | 59 067671 | | 4/1984 | |
| JP | 60 025281 | | 8/1985 | |
| JP | 60 062167 | | 10/1985 | |
| JP | 61 267378 | | 11/1986 | |
| JP | 62 176178 | | 1/1987 | |
| JP | 62 188385 | | 8/1987 | |
| JP | 62 199072 | | 9/1987 | |
| JP | 02-173531 A | * | 7/1990 | G01J 1/02 |
| JP | 03 016265 | | 1/1991 | |
| JP | 05 259433 | | 8/1993 | |
| JP | 05 267639 | | 10/1993 | |
| JP | 06 069491 | | 3/1994 | |
| JP | 07 183483 | | 7/1995 | |
| JP | 09 027611 | | 1/1997 | |

* cited by examiner

OPTICAL SEMICONDUCTOR APPARATUS HAVING A BIDIRECTIONAL COMMUNICATION SYSTEM EMPLOYING A SINGLE-CORE OPTICAL FIBER

RELATED APPLICATION DATA

This application is a divisional of U.S. patent application Ser. No. 11/192,727, filed Jul. 29, 2005, now U.S. Pat. No. 7,196,357 which is a divisional of U.S. patent Ser. No. 10/764,640, filed Jan. 26, 2004 now U.S. Pat. No. 6,960,791 the entirety both of which are incorporated herein by reference to the extent permitted by law. The present application claims priority to Japanese patent application No. 2003-018421 filed in the Japanese Patent Office on Jan. 28, 2003, the entirety of which also is incorporated by reference herein to the extent permitted by law.

BACKGROUND OF THE INVENTION

1. Field of the Invention

The present invention relates to an optical semiconductor apparatus constituting an optical signal transmitter-receiver of a bidirectional communication system using a single-core optical fiber. More specifically, it relates to a monolithically integrated optical semiconductor apparatus structured so that it can be easily aligned with the optical fiber.

2. Description of the Related Art

Recently, single-core bidirectional communication systems that perform bidirectional communication using a single-core optical fiber have been put to practical use and have been applied in a wide range of areas.

Figure 12:
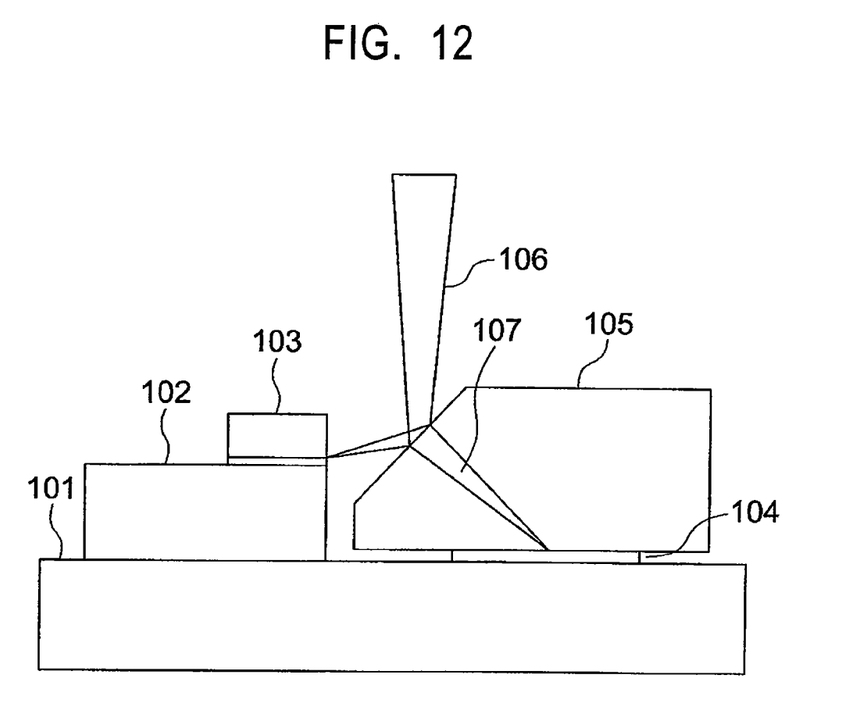
FIG. 12 is a view showing the structure of a known optical signal transmitter-receiver.

Here, with reference to FIG. 12, the structure of a known optical signal transmitter-receiver of a single-core bidirectional communication system is described. FIG. 12 is a view showing the structure of a known optical signal transmitter-receiver of a single-core bidirectional communication system.

A known optical signal transmitter-receiver of a single-core bidirectional communication system, as shown in FIG. 12, has a semiconductor laser device 103 mounted on a submount 102, which is mounted on a substrate 101 having the required electrical wiring, a photodiode 104 directly mounted on the substrate 101, and a prism 105 fixed onto the photodiode 104 with an adhesive.

The laser beam 106 emitted from the semiconductor laser device 103 is reflected upwards at the prism 105. Then the laser beam 106 is transmitted through an optical fiber, not shown in the drawing, positioned above the prism 105 and reaches the other side.

A portion 107 of the laser beam 106 emitted to the other side from the optical fiber is reflected at the prism 105 and then is transmitted through the prism 105 to be received by the photodiode 104.

Such an optical semiconductor apparatus of a single-core bidirectional communication system enables single-core bidirectional communication.

The Japanese Unexamined Patent Application Publication No. 9-45995 discloses an optical signal transmitter-receiver integrating a surface-emitting semiconductor laser device and a light-receiving device as an application of a single-core bidirectional communication. According to the disclosure, the optical signal transmitter-receiver facilitates alignment and can be applied to barcode readers and optical pickups of an optical recorder-player.

[Patent Document 1]

Japanese Unexamined Patent Application Publication No. 9-45995 (p. 3, FIG. 1)

SUMMARY OF THE INVENTION

In the above-mentioned known optical semiconductor apparatus of a single-core bidirectional communication system, the semiconductor laser device 103, the prism 105, and the photodiode 104 must be disposed on the substrate 101 so that the laser beam 106 emitted from the semiconductor laser device 103 is reflected upwards at the prism 105 and enters the optical fiber to reach the other side and so that a portion 107 of the laser beam 106, which reaches the other side through the optical fiber, is transmitted through the prism 105 and reaches the photodiode 104.

It, however, is extremely difficult to actually achieve an optical alignment by mounting the semiconductor laser device 103 on the submount 102, which is mounted on a predetermined position on the substrate 101, directly mounting the photodiode 104 on the substrate 101, and mounting the prism 105 on the photodiode 104, which is mounted on the substrate 101.

Consequently, it is difficult to produce an optical signal transmitter with a high reliability at a low cost.

Thus, an object of the present invention is to provide an optical semiconductor apparatus that functions as a highly reliable optical signal transmitter-receiver for a single-core bidirectional communication system and can be produced inexpensively.

An optical semiconductor apparatus constituting an optical signal transmitter-receiver of a bidirectional communication system employing a single-core fiber comprises a surface-emitting semiconductor laser device and a light-receiving device. The surface-emitting semiconductor laser device and the light-receiving device are disposed on a common substrate. The surface-emitting semiconductor laser device functions as a light signal transmitting device, has a columnar layered structure, and has a light emerging surface on the columnar layered structure. Alternatively, the light-receiving device functions as a light signal receiving device, has an annular layered structure around the surface-emitting semiconductor laser device with an isolation region interposed there between, and has the annular light-receiving surface and the columnar light-emerging surface lying at the same level. The diameter of the light-receiving device is smaller than that of an optical fiber core optically coupled with the optical semiconductor apparatus.

The isolation region is a region electrically separating the devices. The isolation region may be a physical isolation groove or may be an isolation region formed by filling the isolation groove with a dielectric layer, for example a polyimide resin layer.

In a preferable embodiment according to the first aspect, one electrode for the surface-emitting semiconductor laser device and the light-receiving device is disposed on the backside of the semiconductor substrate as a common electrode. Another electrode of the surface-emitting semiconductor laser device is annularly disposed on the layered structure of the surface-emitting semiconductor laser device and extracted by the extraction electrode extended on the light-receiving device disposed on an insulating film. The other electrode of the light-receiving device is annularly disposed on the periphery of the light-receiving surface of the light-receiving device.

An optical semiconductor apparatus constituting an optical signal transmitter-receiver of a bidirectional communication system employing a single-core optical fiber, comprises a light-receiving device and a surface-emitting semiconductor laser device. The light-receiving device functions as a light signal receiving device and a circular layered structure on a semiconductor substrate. The surface-emitting semiconductor laser device functions as a light-transmitting device, is disposed on the central region of the layered structure of the light-receiving device, and has a columnar layered structure with a diameter smaller than the diameter of the light-receiving device. The region on the layered structure of the light-receiving device excluding the region of the surface-emitting semiconductor laser device functions as a light-receiving surface. The diameter of the light-receiving device is smaller than the optical fiber core optically coupled with the optical semiconductor apparatus.

In a preferable embodiment of the second aspect, a first electrode of the light-receiving device is formed on the backside of the semiconductor substrate and a second electrode is formed on the periphery of the light-receiving surface on the layered structure of the light-receiving device. A first electrode of the surface-emitting semiconductor laser device is circularly formed on the layered structure of the surface-emitting semiconductor laser device and a second electrode is formed on the lowermost layer of the layered structure of the surface-emitting semiconductor laser device; here, the surface-emitting semiconductor laser device extends on the layered structure of the light-receiving device outwards from the layered structure of the surface-emitting semiconductor laser device.

An optical semiconductor apparatus constituting an optical signal transmitter-receiver of a bidirectional communication system employing a single-core optical fiber comprises a surface-emitting semiconductor laser device and a light-receiving device. The surface-emitting semiconductor laser device functions as a light signal transmitting device and has a columnar layered structure disposed on a semiconductor substrate. The light-receiving device is disposed on the layered structure of the surface-emitting semiconductor laser device, and has a central opening for exposing the light-emerging surface on the layered structure of the surface-emitting semiconductor laser device. The diameter of the light-receiving device is smaller than the diameter of the optical fiber core optically coupled with the optical semiconductor apparatus.

In the first to third aspects, the light-receiving device is, for example, a photodiode. The photodiode may be a photodiode that can receive a laser beam having an oscillation wavelength of the surface-emitting semiconductor laser device. In this way, an optical transmitter-receiver of a single-core bidirectional communication performing bidirectional communication using a single-core optical fiber may be produced.

The optical semiconductor apparatus according to the first to third aspects are monolithically integrated and, thus, do not require a prism. Therefore, optical alignment is not required as in known optical semiconductor apparatuses and, moreover, optical coupling with optical fiber is facilitated. For these reasons, the optical semiconductor apparatus has high reliability and can be produced inexpensively.

In this way, the size of the optical signal transmitter-receiver can be reduced, and, for example, a super-small size transceiver that allows single-core bidirectional communication can be produced.

There are no limitations on the layers, the semiconductor substrate, and the composition of the compound semiconductor constituting the layered structure of the optical semiconductor apparatus according to the first to third aspects. For example, the present invention may include a III-V compound semiconductor and a GaAs/AlGaAs-based optical semiconductor apparatus. More specifically, the present invention can be preferably applied to an optical semiconductor apparatus having a GaInNAs-based surface-emitting semiconductor laser device and a GaInAs-based photodiode.

According to the first aspect, a surface-emitting semiconductor laser device having a columnar layered structure and a photodiode having a layered structure circularly surrounding the surface-emitting semiconductor laser device is monolithically integrated on a common substrate. Therefore, optical alignment is not required as in known optical semiconductor apparatuses. Moreover, the optical semiconductor apparatus has high reliability and can be produced inexpensively.

According to the second aspect, a photodiode and a surface-emitting semiconductor laser device, which has a columnar layered structure and is formed on the photodiode, are monolithically integrated. Therefore, optical alignment is not required as in known optical semiconductor apparatuses. Moreover, the optical semiconductor apparatus has high reliability and can be produced inexpensively.

According to the third aspect, a surface-emitting semiconductor laser device having a columnar layered structure and a photodiode formed on the surface-emitting semiconductor laser device is monolithically integrated. Therefore, optical alignment is not required as in known optical semiconductor apparatuses. Moreover, the optical semiconductor apparatus has high reliability and can be produced inexpensively.

By applying the optical semiconductor apparatus according to the first to third aspects of the present invention to an optical signal transmitter-receiver of a bidirectional communication system using a single-core optical fiber, for example, a super-small transceiver may be produced.

DESCRIPTION OF THE PREFERRED EMBODIMENTS

Embodiments according to the present invention are described in detail with reference to the drawings. The layer structure, the conductivity type, the film type, the film thickness, the method for forming the film, and the size of the device indicated in the following embodiments are used only for facilitating the understanding of the present invention. The present invention is not limited to these embodiments.

The First Embodiment

Figure 1:
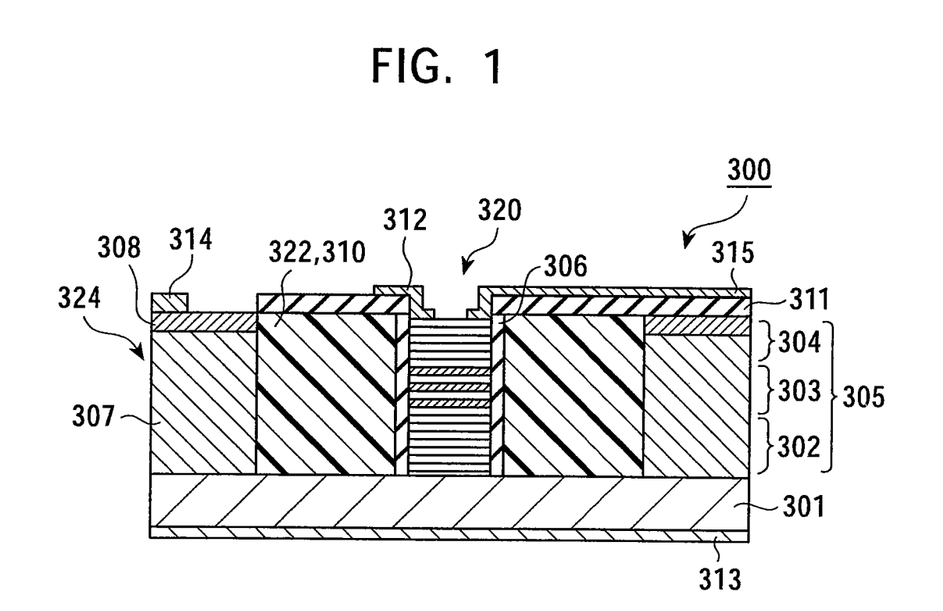
FIG. 1 is a cross-sectional view showing the structure of an optical semiconductor apparatus according to a first embodiment.
Figure 2:
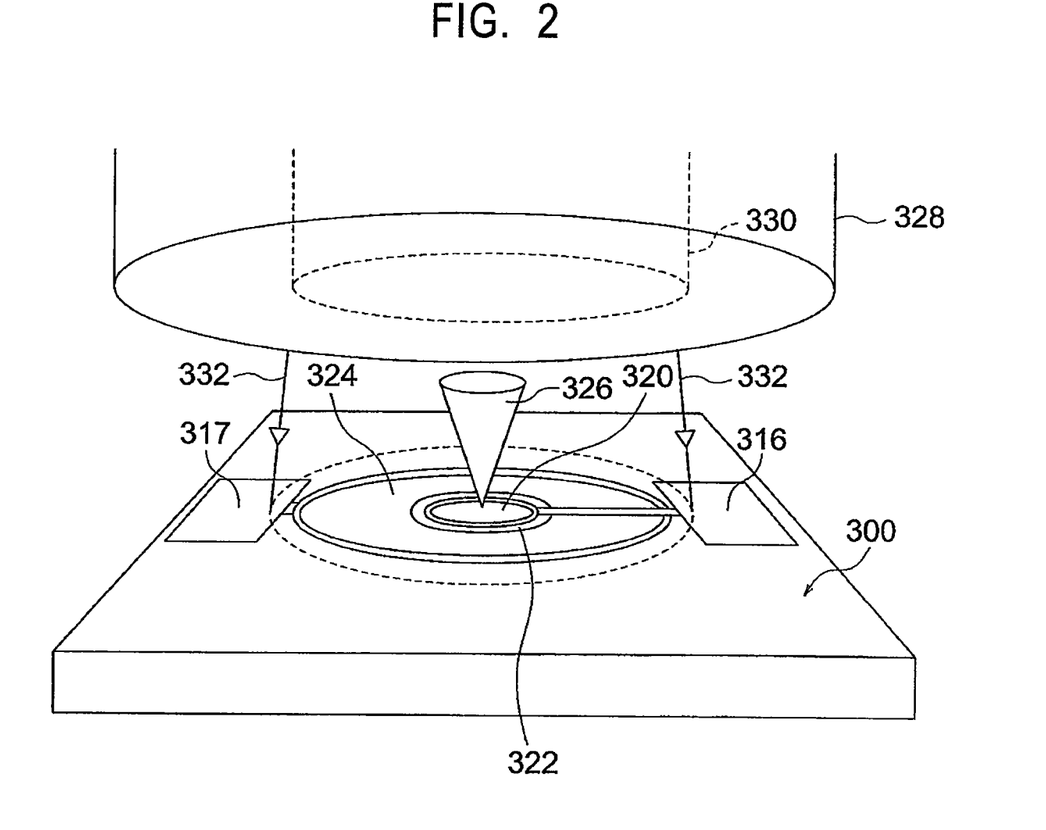
FIG. 2 is a perspective view showing the operations of the optical semiconductor apparatus according to the first embodiment.

This is a first embodiment of the optical semiconductor apparatus according to the first aspect of the present invention. FIG. 1 is a cross-sectional view showing the structure of an optical semiconductor apparatus according to this embodiment. FIG. 2 is a perspective view showing the operation of the optical semiconductor apparatus according to this embodiment.

As shown in FIGS. 1 and 2, an optical semiconductor apparatus 300 according to this embodiment includes a surface-emitting semiconductor laser device 320 and a several-micron wide isolation region 322 that are surrounded by a photodiode 324 and are formed on an n-GaAs substrate 301.

The surface-emitting semiconductor laser device 320 is a columnar layered structure 305 including an n-DBR mirror 302, an active region 303, and a p-DBR mirror 304. The wall of the columnar layered structure is covered with an insulating film 306 composed of a material such as $SiO_2$.

The n-DBR mirror 302 and the p-DBR mirror 304 are reflectors formed of two different types of layers, e.g. layers of $Al_{0.1}Ga_{0.9}As$ and $Al_{0.95}Ga_{0.05}As$, stacked alternately in about 20 to 30 layers. The active region 303 has a multi-quantum well structure in which the GaAs layer is the well and the $Al_{0.3}Ga_{0.7}As$ layer is the barrier.

The photodiode 324 is an annular layered structure composed of an i-GaAs layer 307 and a p-GaAs layer 308 and is formed on the n-GaAs substrate 301. The photodiode 324 surrounds the annual circular isolation region 322, which surrounds the columnar layered structure of the surface-emitting semiconductor laser device 320.

As shown in FIG. 2, the diameter of the photodiode 324 is smaller than the diameter of the optic fiber core optically coupled with the optical semiconductor apparatus 300.

The isolation region 322 is formed by filling the annular isolation groove between the surface-emitting semiconductor laser device 320 and the photodiode 324 with a polyimide resin layer 310. The isolation region 322 reduces the dark currents of the photodiode 324 and crosstalk between the surface-emitting semiconductor laser device 320 and the photodiode 324.

On the p-DBR mirror 304 of the surface-emitting semiconductor laser device 320, a circular p-electrode 312 of the surface-emitting semiconductor laser device 320 is disposed. On the p-GaAs layer 308, a p-electrode 314 of the photodiode 324 is disposed. On the backside of the n-GaAs substrate 301, a common electrode 313 is disposed as an n-electrode of the surface-emitting semiconductor laser device 320 and the photodiode 324.

Furthermore, on the isolation region 322 and the p-GaAs layer 308 of the photodiode 324, an insulating film 311 composed of $SiO_2$ is formed. The p-electrode 312 of the surface-emitting semiconductor laser device 320 is connected to an extraction electrode 316 (refer to FIG. 2) via a leader line 315, these electrodes being formed on the insulating film 311 disposed on the photodiode 324.

The operation of the optical semiconductor apparatus 300 according to this embodiment is described with reference to FIG. 2. FIG. 1 is a perspective view showing the operation of the optical semiconductor apparatus 300 according to this embodiment. In the optical semiconductor apparatus 300, a laser beam 326 emitted from the surface-emitting semiconductor laser device 320 enters a core 330 of an optic fiber 328 and is transmitted to the other side.

The laser beam emitted from the other side diffuses through the core 330 region and is received by the photodiode 324. In FIG. 2, an electrode 317 is disposed on the outside of the photodiode 324 as an extraction electrode of the p-electrode 314 of the photodiode 324.

On the optical semiconductor apparatus 300 according to this embodiment, the surface-emitting semiconductor laser device, which is a light-emitting device, and the photodiode, which is a light-receiving device, are monolithically integrated. For this reason, the devices do not require optical alignment, and thus, facilitate optical coupling with an optical fiber. In this way, the size of the optical signal transmitter-receiver can be reduced, and, for example, a super-small size transceiver that allows single-core bidirectional communication can be produced.

Next, a production method for the optical semiconductor apparatus 300 according to the first embodiment is described with reference to FIGS. 3 to 5. FIGS. 3A to 3C, FIGS. 4D to 4F, and FIGS. 5G to 5I are cross-sectional views of the substrate showing each step for fabricating the optical semiconductor apparatus 300 according to the first embodiment.

Figure 3A:
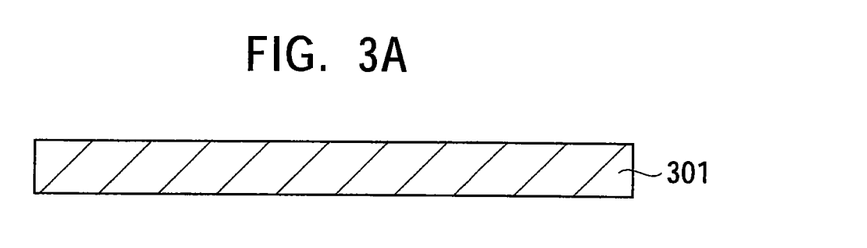
FIGS. 3A to 3C are cross-sectional views of the substrate showing each step for fabricating the optical semiconductor apparatus according to the first embodiment.
Figure 3B:
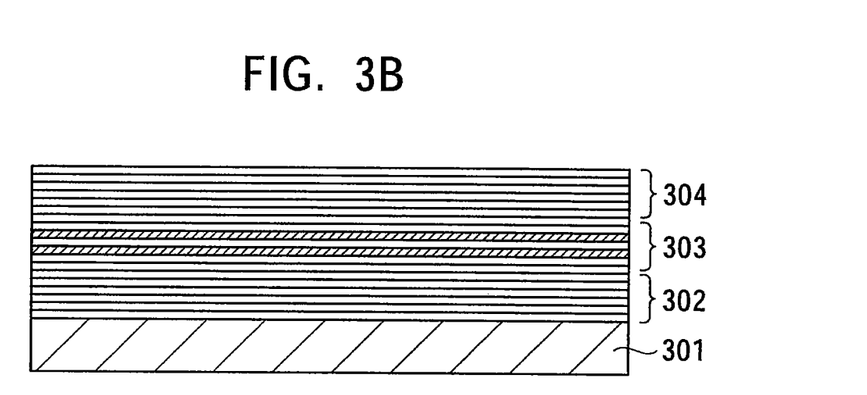

As shown in FIG. 3A, first, an n-GaAs substrate 301 is prepared. Then, as shown in FIG. 3B, the required compound semiconductor layer is epitaxially deposited by employing a method for growing a crystal, such as an MOCVD method, on the n-GaAs substrate 301. In this way, the surface-emitting semiconductor laser device, which is a layered structure, including an n-DBR mirror 302, an active region 303, and a p-DBR mirror 304, is formed.

Figure 3C:
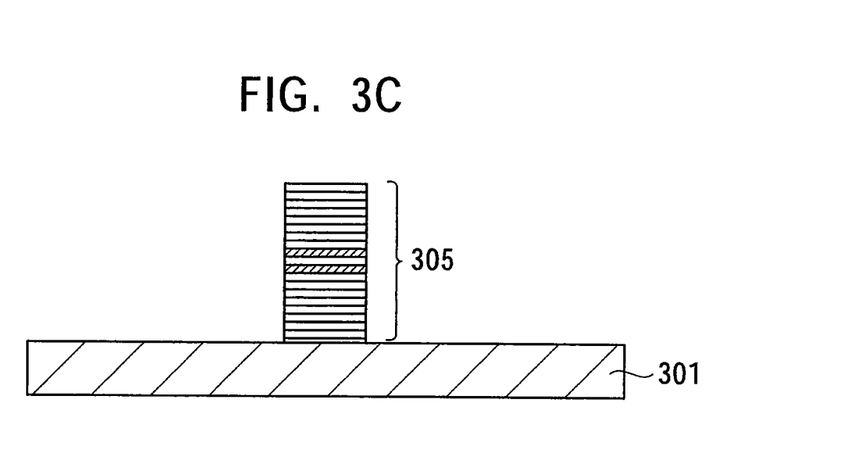

Then, as shown in FIG. 3C, the layered structure is etched by wet-etching or dry-etching to form the columnar layered structure 305.

Figure 4D:
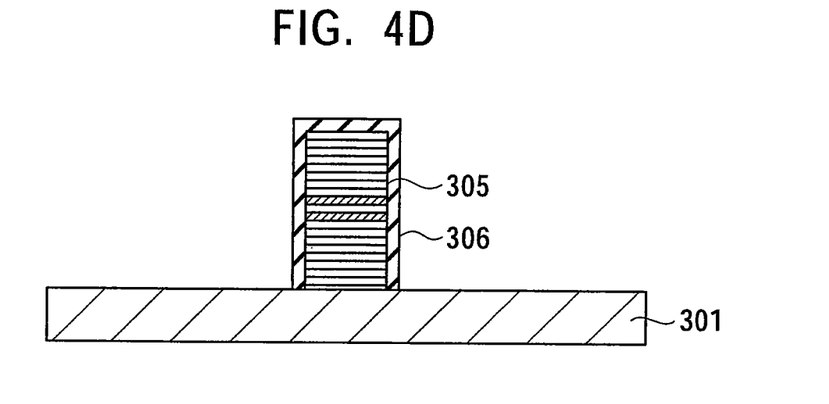
FIGS. 4D to 4F are cross-sectional views of the substrate showing each step, subsequent to FIG. 3C, for fabricating the optical semiconductor apparatus according to the first embodiment.

As shown in FIG. 4D, the insulating film 306 composed of a material such as $SiO_2$ is formed on the columnar layered structure 305 to cover the upper surface and the sides of the columnar layered structure 305.

Figure 4E:
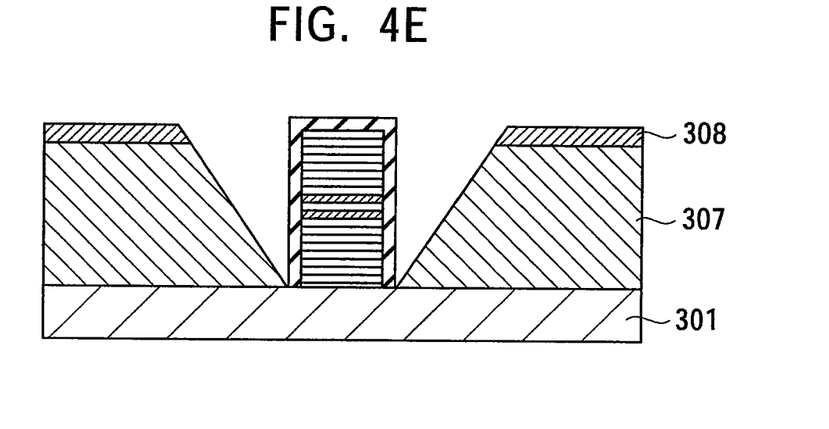
Figure 4F:
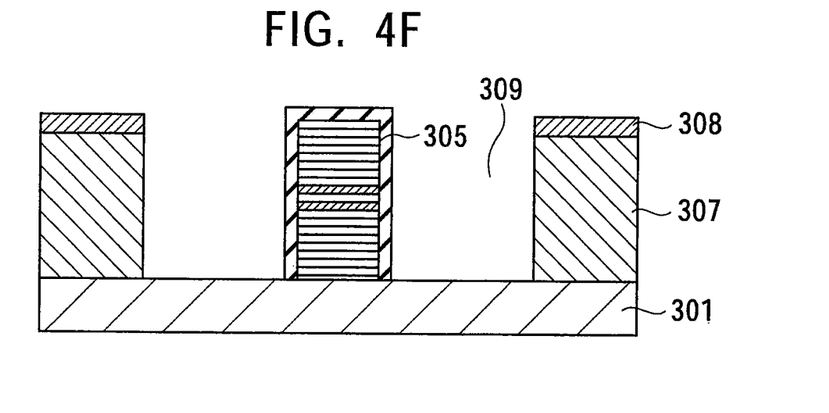

Then, as shown in FIG. 4D, the n-GaAs substrate 301 with the columnar layered structure 305 is placed into a deposition system to selectively deposit the i-GaAs layer 307 and the p-GaAs layer 308 on the n-GaAs substrate 301 around the columnar layered structure 305 as shown in FIG. 4E. In this way, the layered structure of the photodiode 324 is formed.

Subsequently, the selectively deposited i-GaAs layer 307 and p-GaAs layer 308 are etched to expose the n-GaAs substrate 301. In this way, an isolation groove 309 with a width of several microns is formed between the columnar layered structure 305 of the surface-emitting semiconductor laser device 320 and the photodiode 324, as shown in FIG. 4F.

Figure 5G:
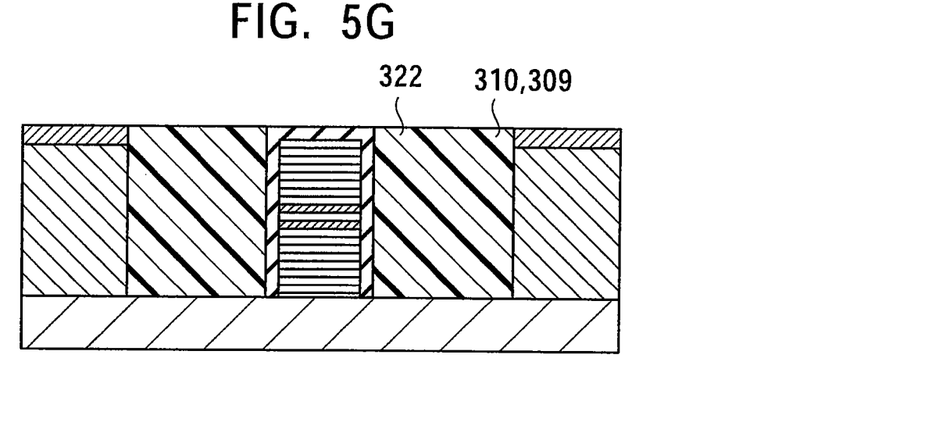
FIGS. 5G to 5I are cross-sectional views of the substrate showing each step, subsequent to FIG. 4F, for fabricating the optical semiconductor apparatus according to the first embodiment.
Figure 5H:
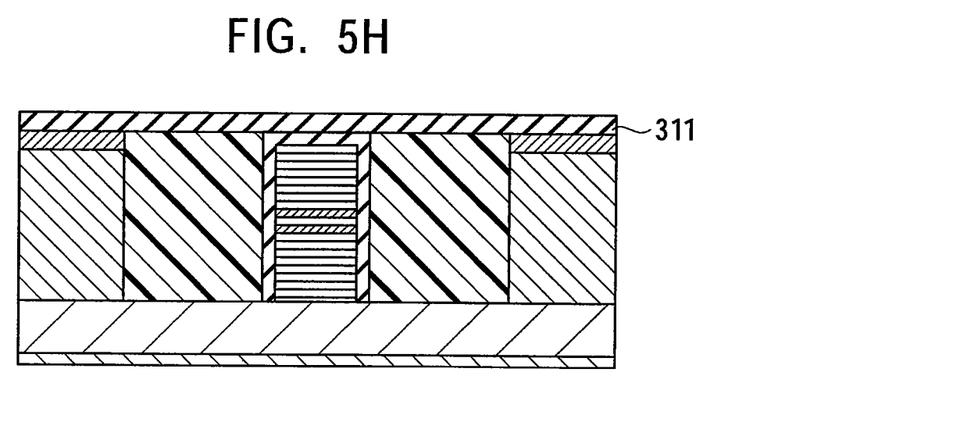
Figure 5I:
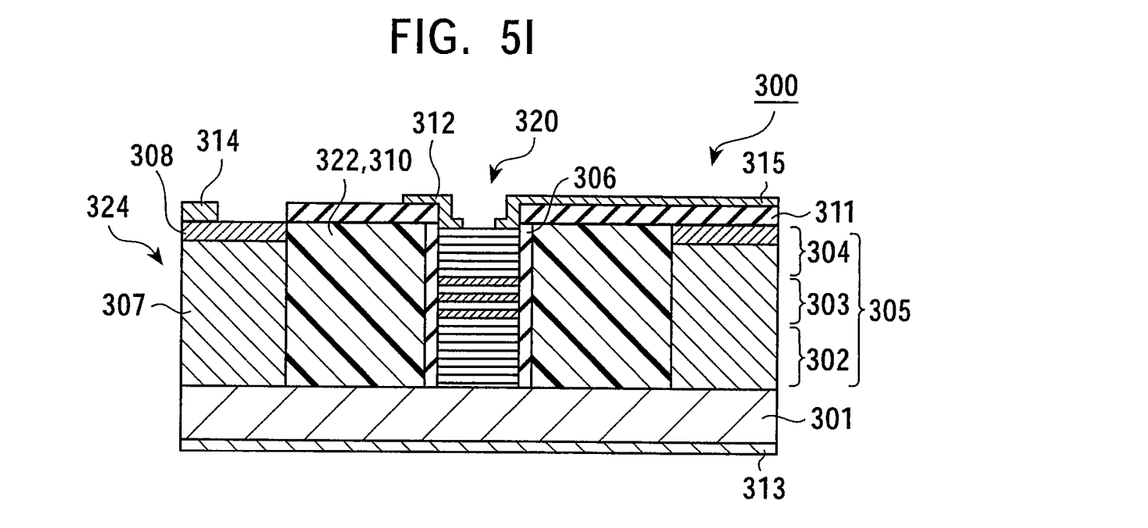

As shown in FIG. 5G, the isolation groove 309 is filled with the polyimide resin layer 310 to form an isolation region 322. Then, as shown in FIG. 5H, an insulating film composed of a material such as $SiO_2$ is formed on the entire surface of the n-GaAs substrate 301. The insulating film 311 is patterned so that it covers the necessary regions of the columnar layered structure 305, the isolation region 322, and the p-GaAs layer 308.

The insulating films 306 and 311 are removed from the columnar layered structure 305, and a p-electrode 312 of the surface-emitting semiconductor laser device 320 is disposed on the p-DBR mirror 304. The insulating film 311 on the p-GaAs layer 308 is removed, a light-receiving surface of the photodiode 324 is formed, and the p-electrode 314 is disposed.

On the backside of the n-GaAs substrate 301, the common electrode 313 is disposed as an n-electrode of the surface-emitting semiconductor laser device 320 and the photodiode 324.

Furthermore, the leader line 315 of the p-electrode 312 of the surface-emitting semiconductor laser device 320 is disposed on the insulating film 311, which is formed on the isolation region 322 and on the p-GaAs layer 308 of the surface-emitting semiconductor laser device 320. The extraction electrode 316 (refer to FIG. 2) connecting to the leader line 315 of the photodiode 324 is disposed. Moreover, the extraction electrode 317 (refer to FIG. 2) of the p-electrode 314 of the photodiode 324 is disposed on the outside of the photodiode 324.

The Second Embodiment

Figure 6:
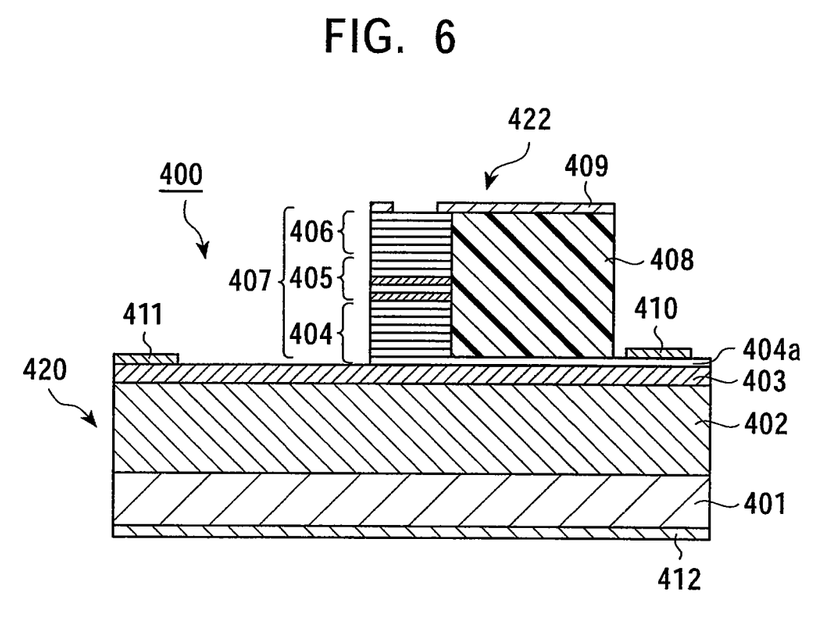
FIG. 6 is a cross-sectional view showing the structure of an optical semiconductor apparatus according to a first embodiment.

This is a second embodiment of the optical semiconductor apparatus according to the present invention. FIG. 6 is a cross-sectional view showing the structure of the optical semiconductor apparatus according to this embodiment.

As shown in FIG. 6, the optical semiconductor apparatus 400 includes a photodiode 420 formed on an n-GaAs substrate 401 and a surface-emitting semiconductor laser device 422 formed on the photodiode 420.

The photodiode 420 is a layered structure composed of an i-GaAs layer 402 and a p-GaAs layer 403 formed on the n-GaAs substrate 401. A p-electrode 411 is disposed on the periphery of the p-GaAs layer 403, and an n-electrode 412 is disposed on the backside of the n-GaAs substrate 401.

The diameter of the layered structure of the photodiode 420 is smaller than the diameter of the optical fiber core optically coupled with the optical semiconductor apparatus 400.

The surface-emitting semiconductor laser device 422 is a columnar structure including an n-DBR mirror 404, an active region 405, and a p-DBR mirror 406 formed on the p-GaAs layer 403 of the photodiode 420. The surface-emitting semiconductor laser device 422 is a columnar layered structure 407 having a diameter smaller than the layered structure of the photodiode 420.

Half of the circumference of the columnar layered structure 407 is surrounded with a polyimide resin layer 408. Instead of the polyimide resin layer 408, the sidewall of the columnar layered structure 407 may be covered with an insulating film.

The n-DBR mirror 404 and the p-DBR mirror 406 are reflectors formed of two different types of layers, e.g. layers of $Al_{0.1}Ga_{0.9}As$ and $Al_{0.9}5Ga_{0.05}As$, stacked alternately in about 20 to 30 layers. The active region 405 has a multi-quantum well structure in which the GaAs layer is the well and the $Al_{0.3}Ga_{0.7}As$ layer is the barrier.

On the p-DBR mirror 406 of the surface-emitting semiconductor laser device 422 and on the polyimide resin layer 408, a circular p-electrode and an extraction electrode 409 for the surface-emitting semiconductor laser device 422 are disposed. An n-electrode 410 of the surface-emitting semiconductor laser device 422 is disposed on the lowermost layer 404a of the n-DBR mirror 404 that extends on the p-GaAs layer 403 of the photodiode 420.

The region on the layered structure of the photodiode 420, not including the region of the surface-emitting semiconductor laser device 422 including the polyimide resin layer 408, forms a light-receiving surface.

On the optical semiconductor apparatus 400 according to this embodiment, the surface-emitting semiconductor laser device, which is a light-emitting device, and the photodiode, which is a light-receiving device, are monolithically integrated. For this reason, the devices do not require optical alignment, and thus, facilitate optical coupling with an optical fiber. In this way, the size of the optical signal transmitter-receiver can be reduced, and, for example, a super-small size transceiver that allows single-core bidirectional communication can be produced.

The production method for the optical semiconductor apparatus 400 is described with reference to FIGS. 7 and 8. FIGS. 7A and 7B and FIGS. 8C and 8D are cross-sectional views of the substrate showing each step for fabricating the optical semiconductor apparatus according to the second embodiment.

Figure 7A:
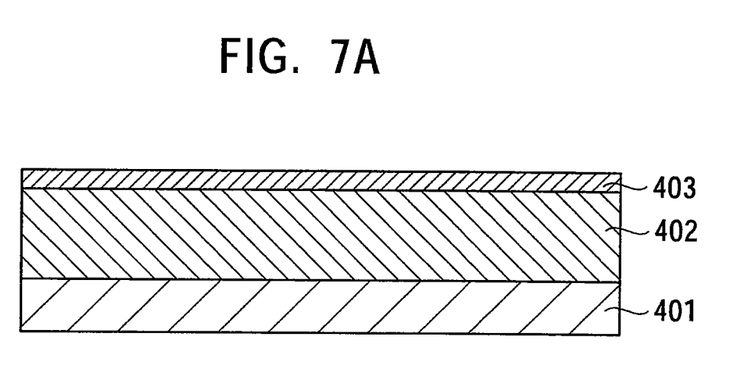
FIGS. 7A and 7B are cross-sectional views of the substrate showing each step for fabricating the optical semiconductor apparatus according to a second embodiment.

As shown in FIG. 7A, first an i-GaAs layer 402 and a p-GaAs layer 403 are epitaxially deposited on the n-GaAs substrate 401 by a method for growing a crystal, such as an MOCVD method. In this way, the layered structure of the photodiode 420 is formed.

Figure 7B:
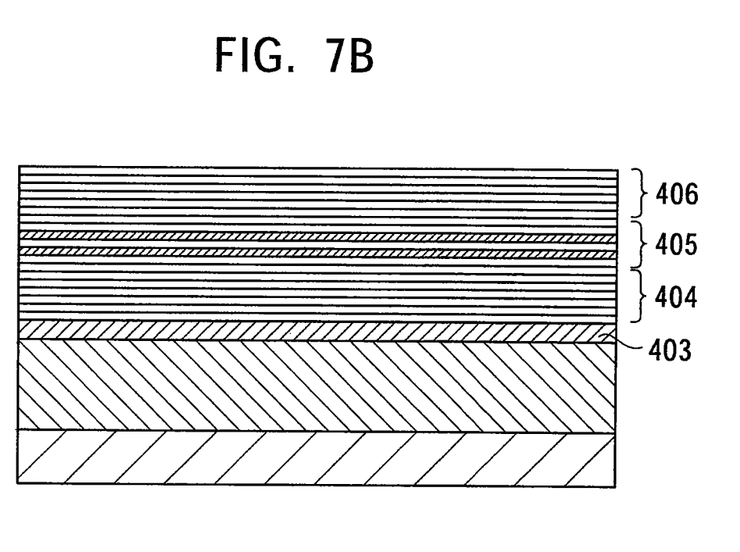

Then, as shown in FIG. 7B, a required compound semiconductor layer is epitaxially deposited on the p-GaAs layer 403 by methods such as the MOCVD method. In this way, the surface-emitting semiconductor laser device, which is a layered structure, including an n-DBR mirror 404, an active region 402, and a p-DBR mirror 406, is formed.

Figure 8C:
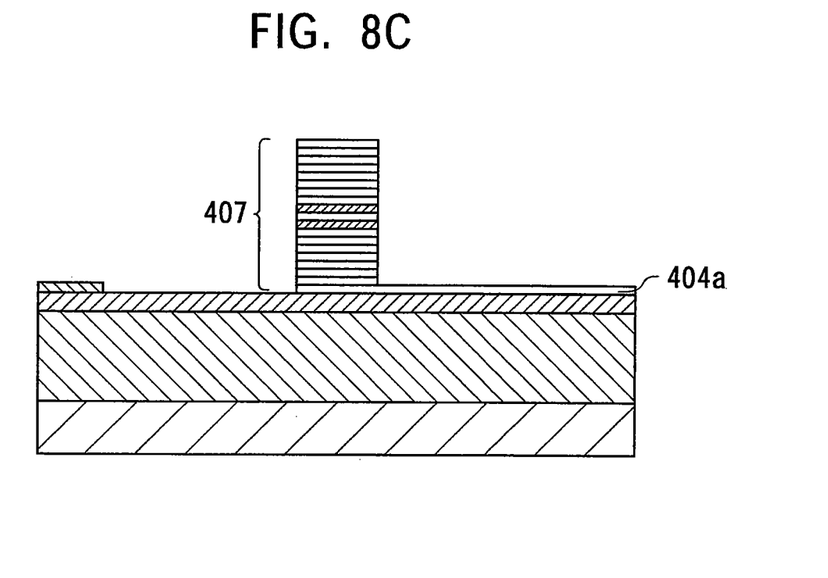
FIGS. 8C and 8D are cross-sectional views of the substrate showing each step, subsequent to FIG. 7B, for fabricating the optical semiconductor apparatus according to the second embodiment.

As shown in FIG. 8C, etching is performed to form the columnar layered structure 407 of the surface-emitting semiconductor laser device 422 while the lowermost layer 404a of the n-DBR mirror 404 is left unetched.

Figure 8D:
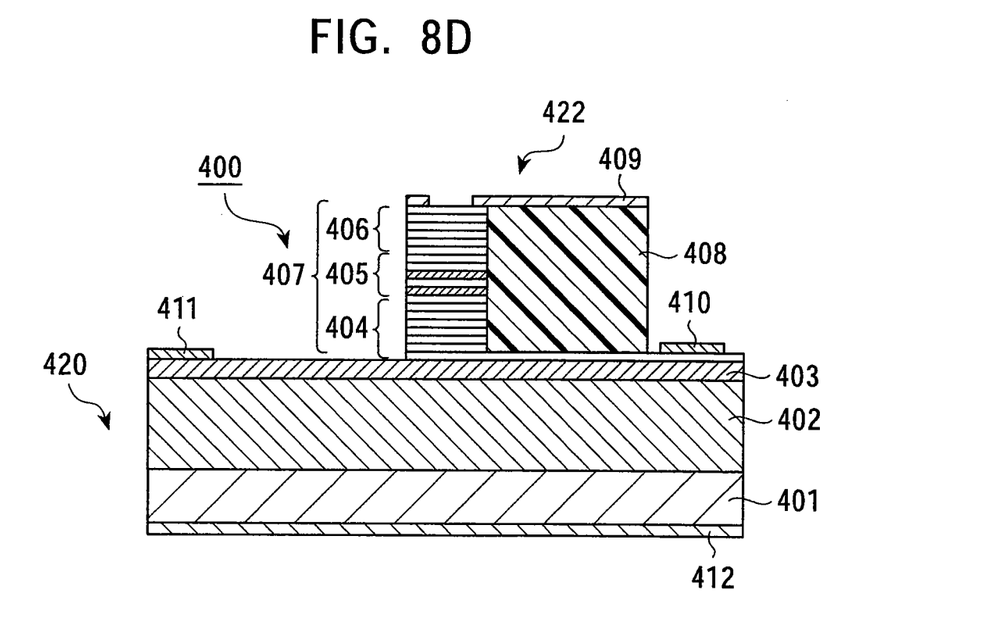

Then, as shown in FIG. 8D, half of the circumference of the columnar layered structure 407 is surrounded with a polyimide resin layer 408. Subsequently, the circular p-electrode and the extraction electrode 409 of the surface-emitting semiconductor laser device 422 are disposed on the p-DBR mirror 406 of the surface-emitting semiconductor laser device 422 and the polyimide resin layer 408. Also, the n-electrode 410 of the surface-emitting semiconductor laser device 422 is disposed on the lowermost layer 404a of the n-DBR mirror 404, which extends on the p-GaAs layer 403 of the photodiode 420.

Moreover, the p-electrode 411 and the n-electrode 412 of the photodiode 420 are disposed on the periphery of the p-GaAs layer 403 and the backside of the n-GaAs substrate 401, respectively.

The Third Embodiment

Figure 9:
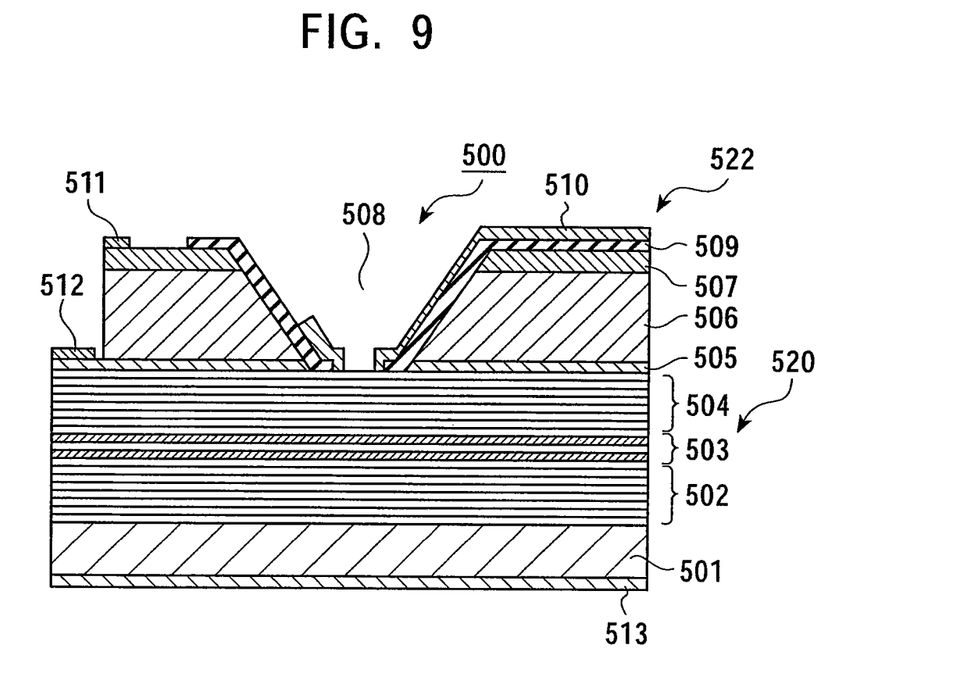
FIG. 9 is a cross-sectional view showing the structure of an optical semiconductor apparatus according to a third embodiment.

This is a third embodiment of the optical semiconductor apparatus according to the present invention. FIG. 9 is a cross-sectional view showing the structure of the optical semiconductor apparatus according to this embodiment.

As shown in FIG. 9, the optical semiconductor apparatus according to this embodiment includes a surface-emitting semiconductor laser device 520 formed on an n-GaAs substrate 501 and a photodiode 522 formed on the surface-emitting semiconductor laser device 520.

The surface-emitting semiconductor laser device 520 is a layered structure composed of an n-DBR mirror 502, an active region 503, and a p-DBR mirror 504 formed on the n-GaAs substrate 501.

The n-DBR mirror 502 and the p-DBR mirror 504 are reflectors formed of two different types of layers, e.g. layers of $Al_{0.1}Ga_{0.9}As$ and $Al_{0.9}5Ga_{0.05}As$, stacked alternately in about 20 to 30 layers. The active region 503 has a multi-quantum well structure in which the GaAs layer is the well and the $Al_{0.3}Ga_{0.7}As$ layer is the barrier.

The photodiode 522 is a layered structure formed of an n-GaAs layer 505, an i-GaAs layer 506, and a p-GaAs layer 507 sequentially deposited on the p-DBR mirror 504 of the surface-emitting semiconductor laser device 520.

A p-electrode 511 of the photodiode 522 is disposed on the periphery of the p-GaAs layer 507. A portion of the sidewall of the layered structure is removed to expose the n-GaAs layer 505. An n-electrode 512 is disposed on the exposed n-GaAs layer 505.

The layered structure of the photodiode 522 has an inverted, truncated cone-shaped opening 508 in the center. The p-DBR mirror 504 of the surface-emitting semiconductor laser device 520 is exposed at the bottom of the opening 508. On the sidewall of the inverted, truncated cone-shaped opening 508, an insulating film 509 is formed. Also, a p-electrode and an extraction electrode 510 of the surface-emitting semiconductor laser device 520, which are composed of a metal film electrically connected to the p-DBR mirror 504 at the bottom of the opening 508, extend on the insulating film 509 and over the p-GaAs layer 507.

The n-electrode 513 of the surface-emitting semiconductor laser device 520 is disposed on the backside of the n-GaAs substrate 501.

On the optical semiconductor apparatus 500 according to this embodiment, the surface-emitting semiconductor laser device, which is a light-emitting device, and the photodiode, which is a light-receiving device, are monolithically integrated. For this reason, the devices do not require optical alignment, and thus, facilitate optical coupling with an optical fiber. In this way, the size of the optical signal transmitter-receiver can be reduced, and, for example, a super-small size transceiver that allows single-core bidirectional communication can be produced.

Figure 10A:
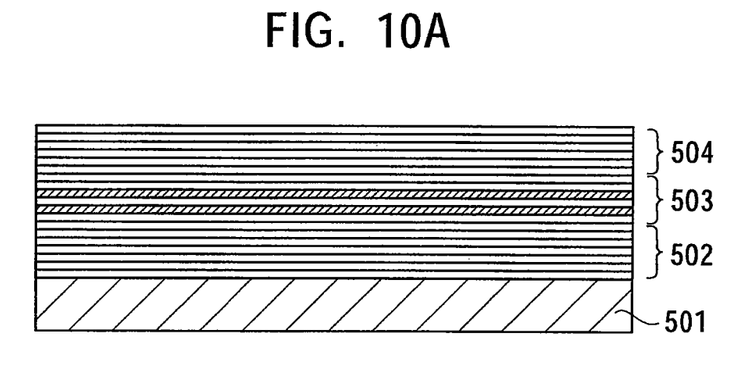
FIGS. 10A and 10B are cross-sectional views of the substrate showing each step for fabricating the optical semiconductor apparatus according to a third embodiment.
Figure 10B:
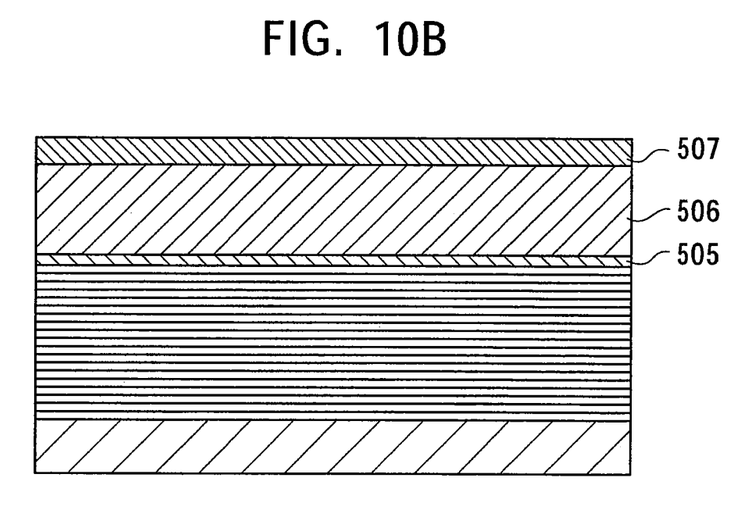
Figure 11C:
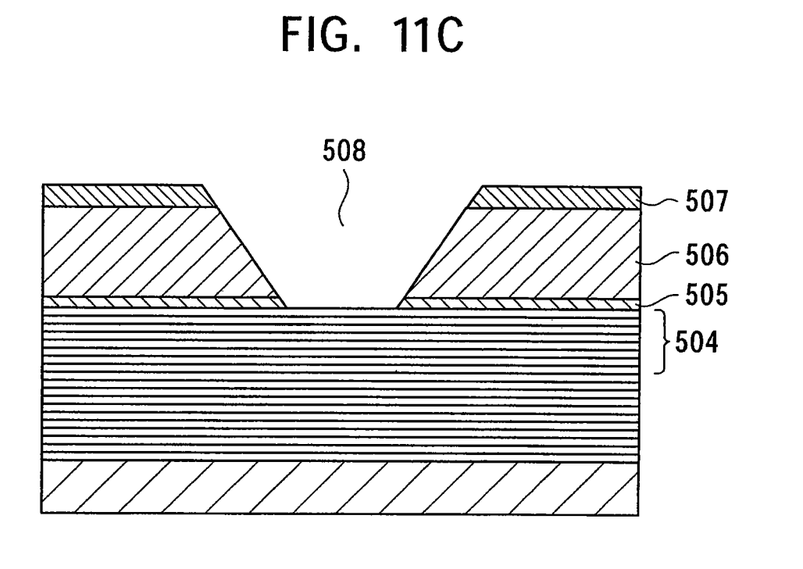
FIGS. 11C and 11D are cross-sectional views of the substrate showing each step, subsequent to FIG. 10B, for fabricating the optical semiconductor apparatus according to the third embodiment.
Figure 11D:
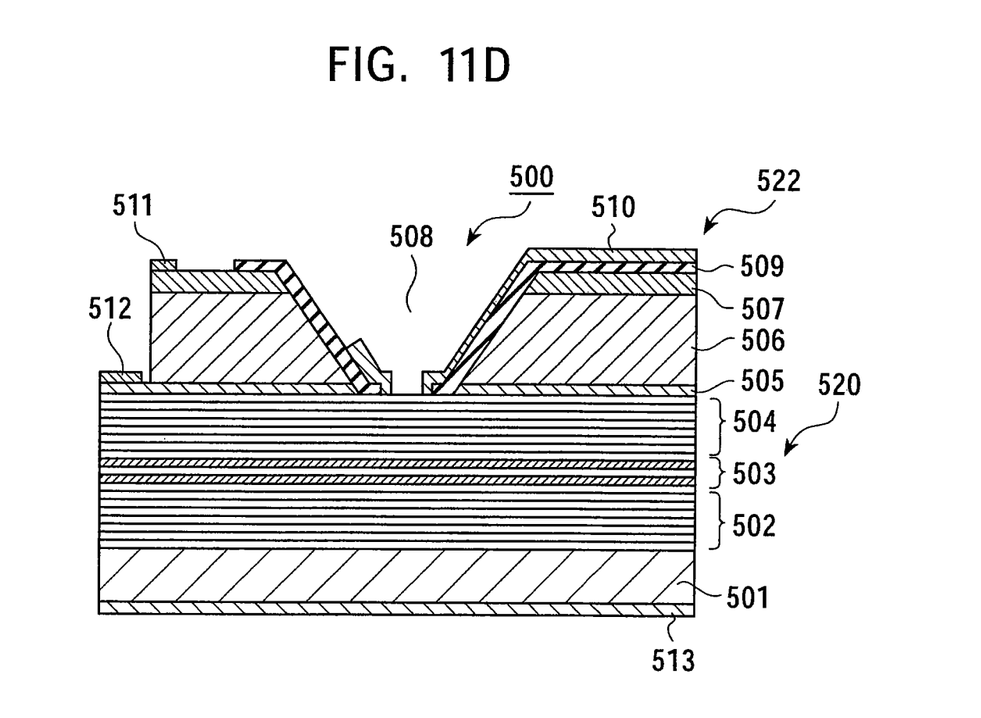

With reference to FIGS. 10 and 11, the production method for the optical semiconductor apparatus according to the third embodiment is described. FIGS. 10A and 10B and FIGS. 11C and 11D are cross-sectional views of the substrate showing step for fabricating the optical semiconductor apparatus according to the third embodiment.

First, as shown in FIG. 10A, a required compound semiconductor layer is epitaxially deposited on the n-GaAs substrate 501 by a method for growing a crystal, such as an MOCVD method. In this way, the surface-emitting semiconductor laser device 520, which is a layered structure including an n-DBR mirror 502, an active region 503, and a p-DBR mirror 504, is formed.

Then, on the p-DBR mirror 504 of the surface-emitting semiconductor laser device 520, the n-GaAs layer 505, the i-GaAs layer 506, and the p-GaAs layer 507 are epitaxially deposited to form the layered structure of the photodiode 522.

Then, as shown in FIG. 1C, the p-GaAs layer 507, the i-GaAs layer 506, and the n-GaAs layer 505 composing the layered structure of the photodiode 522 are wet-etched to form the inverted, truncated cone-shaped opening 508 in the center of the layered structure. At the bottom of the opening 508, the p-DBR mirror 504 of the surface-emitting semiconductor laser device 520 is exposed.

Then, as shown in FIG. 1D, an insulating film 509 composed of a material such as $SiO_2$ is formed on the sidewall of the opening 508. Then the insulating film 509 covering the p-DBR mirror 504 at the bottom of the opening 508 is removed to form a window for transmitting the laser beam. Subsequently, the annular p-electrode 510 of the surface-emitting semiconductor laser device 520 is formed on the p-DBR mirror 504 at the bottom of the opening 508. Also, an extraction electrode of the p-electrode 510 is formed on the insulating film 509.

A portion of the sidewall of the layered structure of the photodiode 522 is removed to form the n-electrode 512 of the photodiode 522 on the n-GaAs layer 505, and the n-electrode 513 of the surface-emitting semiconductor laser device 520 is formed on the backside of the n-GaAs substrate 501.

In this way, the optical semiconductor apparatus 400 according to this embodiment is fabricated.

The optical semiconductor apparatuses 400 and 500 according to the second and third embodiments, respectively, are advantageous in that a layered structure of the surface-emitting semiconductor laser device and the photodiode can be formed in a single step of epitaxial deposition.

The first to third embodiments have an active layer of a quantum well structure of GaAs and include a surface-emitting semiconductor laser device with an oscillation wave length in the range of 0.85 μm and a GaAs photodiode that can receive laser beams in the range of 0.85 μm.

Alternatively, a combination of a surface-emitting semiconductor laser device with an oscillation wave length in the range of 1.3 μm composed of GaInNAs-based materials and a photodiode composed of GaInAs may be used. GaInAs, however, has a several-percent lattice dislocation with GaAs. Therefore, a buffer layer should preferably be disposed on the boundary face of the GaAs substrate or the surface-emitting semiconductor laser device.

Moreover, the present invention may be employed for an optical semiconductor apparatus including a combination of InGaAsP-based material composed on an InP substrate.

What is claimed is:

1. An optical semiconductor apparatus including an optical signal transmitter-receiver of a bidirectional communication system employing a single-core optical fiber, comprising:
    a substrate;
    a light-receiving device having layered structure on the substrate;
    a surface-emitting semiconductor laser device having a columnar structure on the light-receiving device; and
    a resin layer in contact with at least part of an active region of the surface-emitting semiconductor laser device, the resin layer surrounding only half of the circumference of the columnar structure on the substrate thus imparting a resin side of the columnar structure and a non-resin side of the columnar structure,
    wherein,
        the surface-emitting semiconductor laser device and the light-receiving device are monolithically integrated on the same substrate,
        the surface-emitting semiconductor laser device has a lower electrode that is on the resin side of the columnar structure and the light-receiving device has an upper electrode that is on the non-resin side of the columnar structure,
        a diameter of the surface-emitting semiconductor laser device is smaller than a diameter of the light-receiving device, and
        a diameter of the light-receiving device is smaller than a diameter of a core of the single-core optical fiber optically coupled with the semiconductor apparatus.

2. The optical semiconductor apparatus according to claim 1, wherein:
    the light-receiving device has a lower electrode that is disposed on a backside of the substrate and the upper electrode of the light-receiving device is disposed on a periphery of a light-receiving surface on the layered structure of the light-receiving device,
the surface-emitting semiconductor laser device has an upper electrode that is circularly disposed on the surface-emitting semiconductor laser device, and
the lower electrode of the surface-emitting semiconductor laser device is disposed on a lowermost layer of the columnar structure of the surface-emitting semiconductor laser device, the lowermost layer extending outwards from an upper portion of the columnar structure of the surface-emitting semiconductor laser device and extending over a greater region of the layered structure of the light-receiving device than that of the upper portion of the columnar structure of the surface-emitting semiconductor laser device.

3. The optical semiconductor apparatus according to claim 1, wherein the light-receiving device is capable of receiving a laser beam with an oscillation wave length of the surface-emitting semiconductor laser device.

* * * * *